(12) United States Patent  
Hu

(10) Patent No.: US 7,723,841 B2  
(45) Date of Patent: May 25, 2010

(54) THERMAL SPACER FOR STACKED DIE PACKAGE THERMAL MANAGEMENT

(75) Inventor: Xuejiao Hu, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 581 days.

(21) Appl. No.: 11/644,297

(22) Filed: Dec. 22, 2006

(65) Prior Publication Data

US 2008/0150112 A1    Jun. 26, 2008

(51) Int. Cl.
H01L 23/10 (2006.01)
H01L 23/34 (2006.01)

(52) U.S. Cl. .................. 257/706; 257/686; 257/707; 438/127; 438/122; 438/124

(58) Field of Classification Search ............ 257/707, 257/706, 686; 438/127, 122, 124
See application file for complete search history.

(56) References Cited

U.S. PATENT DOCUMENTS

| | | | | |
|---|---|---|---|---|
| 5,358,032 | A * | 10/1994 | Arai et al. | 165/80.3 |
| 6,492,726 | B1 * | 12/2002 | Quek et al. | 257/723 |
| 2005/0230800 | A1 * | 10/2005 | Do et al. | 257/686 |
| 2006/0182076 | A1 * | 8/2006 | Wang | 370/338 |
| 2007/0013042 | A1 * | 1/2007 | Henell et al. | 257/686 |
| 2007/0155328 | A1 * | 7/2007 | Turner | 455/62 |

OTHER PUBLICATIONS

Yamada et al. "The Study of Silicon Die Stress in Stacked Die Packages", Dec. 2005, EMAP 2005 International Symposium on Electronics Materials and Packaging, Institutuion of Engineering and Technology, pp. 74-77.*

Akhter et al. "Design for Stackability of Flash Memory Devices Based on Thermal Optimization", 24th Digital Avionics Systems Conference, Oct. 30, 2005, pp. 9.C.1-1 to 9.C.1-14.*

* cited by examiner

Primary Examiner—Zandra Smith
Assistant Examiner—Telly D Green
(74) Attorney, Agent, or Firm—David L. Guglielmi

(57) ABSTRACT

In some embodiments, a thermal spacer for stacked die package thermal management is presented. In this regard, an apparatus is introduced having a top integrated circuit die, a bottom integrated circuit die, and a thermal spacer between the top and bottom integrated circuit dice, the thermal spacer comprising a heat conducting material and the thermal spacer overhanging and extending parallel with one outside edge of the bottom integrated circuit die. Other embodiments are also disclosed and claimed.

11 Claims, 2 Drawing Sheets

THERMAL SPACER FOR STACKED DIE PACKAGE THERMAL MANAGEMENT

FIELD OF THE INVENTION

Embodiments of the present invention generally relate to the field of integrated circuit packages, and, more particularly to a thermal spacer for stacked die package thermal management.

BACKGROUND OF THE INVENTION

The demand for enhanced performance and functionality of integrated circuit components continues to increase design and fabrication complexity. An integrated circuit package can have increased flexibility and functionality within the same footprint by stacking multiple dice on top of each other. However, if the dice to be stacked are high frequency active dice, there could be thermal management issues.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
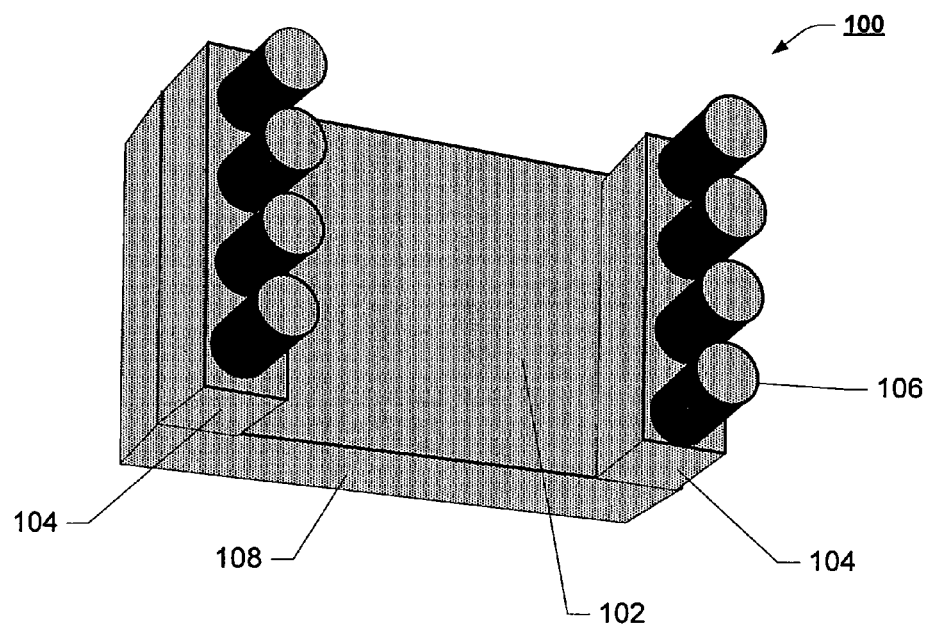
FIG. 1 is a graphical illustration of a three-dimensional view of a thermal spacer for stacked die package thermal management, in accordance with one example embodiment of the invention.

FIG. 1 is a graphical illustration of a three-dimensional view of a thermal spacer for stacked die package thermal management, in accordance with one example embodiment of the invention. In accordance with the illustrated example embodiment, thermal spacer 100 includes one or more of contact surface 102, edge overhangs 104, pin 106, and wirebond edge 108.

Thermal spacer 100 may be made of any heat conductive material. In one embodiment, thermal spacer 100 is made primarily of ceramic. In another embodiment, thermal spacer 100 is made primarily of metal.

Figure 2:
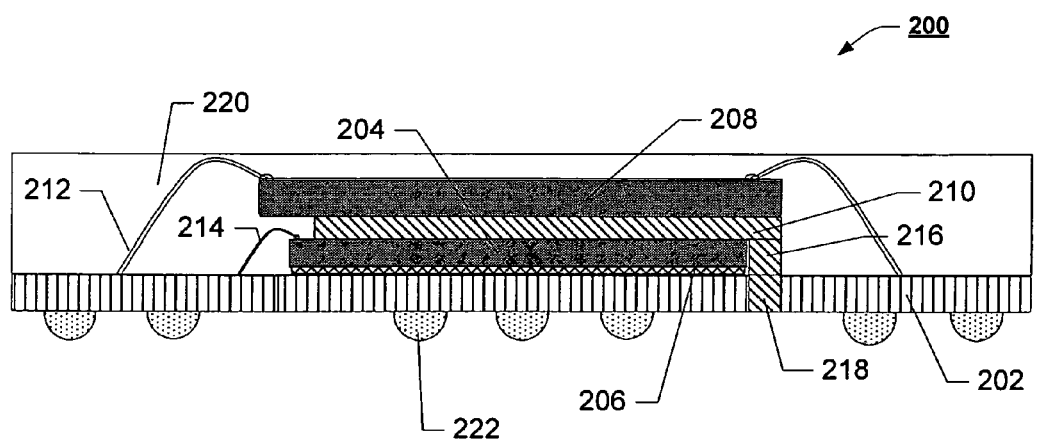
FIG. 2 is a graphical illustration of a cross-sectional view of a stacked die package with a thermal spacer for stacked die package thermal management, in accordance with one example embodiment of the invention.

Contact surface 102 is designed to contact the top surface of an integrated circuit die in a stacked die thermal package, as depicted in FIG. 2. Heat from the integrated circuit die would be conducted through contact surface 102 to throughout thermal spacer 100.

Edge overhangs 104 are designed to hang over and extend along an outside edge of the associated integrated circuit die. In one embodiment, the height of edge overhangs 104 is designed to contact a package substrate. One skilled in the art would appreciate that edge overhangs 104 would enable heat to be further distributed. While depicted with two edge overhangs 104, thermal spacer 100 may also be implemented with overhangs on just one or on three sides of contact surface 102.

Pin 106, included in some embodiments of thermal spacer 100, is designed to mate with a hole in a package substrate, as depicted in FIG. 2, to further distribute heat.

Wirebond edge 108 is designed to allow contacts on an associated integrated circuit die to be exposed to allow for wirebonding, as depicted in FIG. 2. Wirebond edge 108 may also be implemented on two or three sides of contact surface 102.

FIG. 2 is a graphical illustration of a cross-sectional view of a stacked die package with a thermal spacer for stacked die package thermal management, in accordance with one example embodiment of the invention. As shown, package 200 includes one or more of substrate 202, bottom die 204, adhesive 206, top die 208, thermal spacer 210, top die wire 212, bottom die wire 214, overhang edge 216, pin 218, mold 220, and solder ball 222.

Substrate 202 represents a substrate that may comprise multiple conductive layers laminated together. Substrate 202 may be laminated with dielectric material as part of a substrate build-up and may have insulated traces and vias routed through it.

Bottom die 204 represents an integrated circuit die. In one embodiment, bottom die 204 represents a memory device. In another embodiment, bottom die 204 represents a logic device. Bottom die 204 is mechanically attached to substrate 202 by adhesive 206, which represents a thin-film attachment material. Top die 208 is mechanically attached to thermal spacer 210 by adhesive. In one embodiment, top die 208 is a radio frequency (RF) media access control (MAC) integrated circuit (IC) die and bottom die 204 is a RF radio IC die.

Thermal spacer 210 is comprised primarily of a heat conducting material, such as silicon, diamond, ceramic or metal, to distribute heat from the top of bottom die 204 and the bottom of top die 208.

Top die wire 212 and bottom die wire 214 represents wirebonding that electrically couples top die 208 and bottom die 204, respectively, to contacts on top of surface 202.

Overhang edge 216 of thermal spacer 210 overhangs and extends parallel with one outside edge of bottom die 204. As shown, overhang edge 216 contacts substrate 202 enabling further distribution of heat. While shown overhanging one side of bottom die 204, overhang edge 216 may be implemented on any number of sides so long as accommodations are made for wirebonding.

Pin 218 may be coupled to overhang edge 216 to mate with a hole in substrate 202, enabling further distribution of heat.

Mold 220 is used to protect dice 204 and 208 as well as wires 212 and 214. In one embodiment, mold 220 is an epoxy resin compound.

Solder ball 222 may be added to package 200 to allow package 200 to be coupled, for example to a substrate or printed circuit board. Other electrical interfaces besides solder balls may also be utilized.

Figure 3:
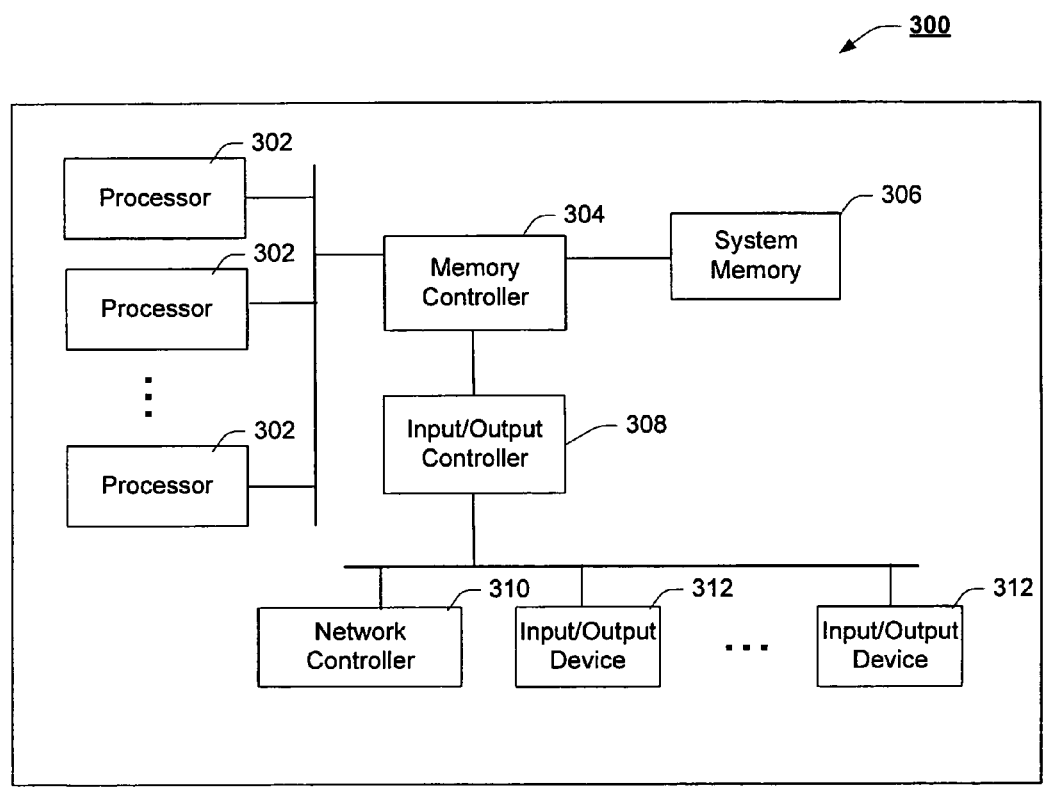
FIG. 3 is a block diagram of an example electronic appliance suitable for implementing a thermal spacer for stacked die package thermal management, in accordance with one example embodiment of the invention.

FIG. 3 is a block diagram of an example electronic appliance suitable for implementing a thermal spacer for stacked die package thermal management, in accordance with one example embodiment of the invention. Electronic appliance 300 is intended to represent any of a wide variety of traditional and non-traditional electronic appliances, laptops, desktops, cell phones, wireless communication subscriber units, wireless communication telephony infrastructure elements, personal digital assistants, set-top boxes, or any electric appliance that would benefit from the teachings of the present invention. In accordance with the illustrated example embodiment, electronic appliance 300 may include one or more of processor(s) 302, memory controller 304, system memory 306, input/output controller 308, network controller 310, and input/output device(s) 312 coupled as shown in FIG. 3. Network controller 310, or other integrated circuit components of electronic appliance 300, may be housed in a package including a slotted substrate described previously as an embodiment of the present invention.

Processor(s) 302 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect. In one embodiment, processors(s) 302 are Intel® compatible processors. Processor(s) 302 may have an instruction set containing a plurality of machine level instructions that may be invoked, for example by an application or operating system.

Memory controller 304 may represent any type of chipset or control logic that interfaces system memory 306 with the other components of electronic appliance 300. In one embodiment, the connection between processor(s) 302 and memory controller 304 may be referred to as a front-side bus. In another embodiment, memory controller 304 may be referred to as a north bridge.

System memory 306 may represent any type of memory device(s) used to store data and instructions that may have been or will be used by processor(s) 302. Typically, though the invention is not limited in this respect, system memory 306 will consist of dynamic random access memory (DRAM). In one embodiment, system memory 306 may consist of Rambus DRAM (RDRAM). In another embodiment, system memory 306 may consist of double data rate synchronous DRAM (DDRSDRAM).

Input/output (I/O) controller 308 may represent any type of chipset or control logic that interfaces I/O device(s) 312 with the other components of electronic appliance 300. In one embodiment, I/O controller 308 may be referred to as a south bridge. In another embodiment, I/O controller 308 may comply with the Peripheral Component Interconnect (PCI) Express™ Base Specification, Revision 1.0a, PCI Special Interest Group, released Apr. 15, 2003.

Network controller 310 may represent any type of device that allows electronic appliance 300 to communicate with other electronic appliances or devices. In one embodiment, network controller 310 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 310 may be an Ethernet network interface card.

Input/output (I/O) device(s) 312 may represent any type of device, peripheral or component that provides input to or processes output from electronic appliance 300.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. An apparatus comprising:
    a top integrated circuit die;
    a bottom integrated circuit die; and
    a thermal spacer between the top and bottom integrated circuit dice, the thermal spacer comprising a heat conducting material and the thermal spacer overhanging and covering one side surface of the bottom integrated circuit die.

2. The apparatus of claim 1, further comprising the thermal spacer coupled with a substrate.

3. The apparatus of claim 1, wherein the thermal spacer comprises a primary material chosen from the group consisting of: silicon, diamond, ceramic and metal.

4. The apparatus of claim 1, further comprising pins coupled with the thermal spacer mated with holes in a substrate surface.

5. The apparatus of claim 1, wherein the bottom integrated circuit die comprises a radio frequency radio die.

6. The apparatus of claim 1, wherein the top integrated circuit die comprises a radio frequency media access control die.

7. An electronic appliance comprising:
    a processor;
    a system memory; and
    a network controller, wherein the network controller includes top and bottom integrated circuit dice and a thermal spacer made of heat conductive material between the dice, the thermal spacer overhanging and covering one side surface of the bottom integrated circuit die.

8. The electronic appliance of claim 7, further comprising the thermal spacer coupled with a substrate.

9. The electronic appliance of claim 7, wherein the thermal spacer comprises a primary material chosen from the group consisting of: silicon, diamond, ceramic and metal.

10. The electronic appliance of claim 7, further comprising pins coupled with the thermal spacer mated with holes in a substrate surface.

11. The electronic appliance of claim 7, wherein the bottom integrated circuit die comprises a radio frequency radio die.

* * * * *